United States Patent
Lin et al.

(10) Patent No.: US 9,666,568 B2
(45) Date of Patent: May 30, 2017

(54) PHOTOELECTRIC DEVICE AND METHOD OF MANUFACTURING THE SAME

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 15/222,978

(22) Filed: Jul. 29, 2016

(65) Prior Publication Data
US 2016/0336305 A1    Nov. 17, 2016

Related U.S. Application Data (62) Division of application No. 14/524,415, filed on Oct. 27, 2014, now Pat. No. 9,437,585.

(30) Foreign Application Priority Data

Dec. 17, 2013    (CN) .......................... 2013 1 0687978

(51) Int. Cl.
| | |
|---|---|
| H01L 33/62 | (2010.01) |
| H01L 25/16 | (2006.01) |
| H01L 33/60 | (2010.01) |
| H01L 33/52 | (2010.01) |
| H01L 23/60 | (2006.01) |

(Continued)

(52) U.S. Cl.
CPC ............ *H01L 25/167* (2013.01); *H01L 23/60* (2013.01); *H01L 25/165* (2013.01); *H01L 33/483* (2013.01); *H01L 33/52* (2013.01); *H01L 33/60* (2013.01); *H01L 33/62* (2013.01); *H01L 29/866* (2013.01); *H01L 2224/16245* (2013.01); *H01L 2224/48091* (2013.01); *H01L 2224/48247* (2013.01); *H01L 2933/005* (2013.01); *H01L 2933/0033* (2013.01); *H01L 2933/0058* (2013.01); *H01L 2933/0066* (2013.01)

(58) Field of Classification Search
CPC ....................................................... H01L 33/62
USPC ....................................................... 257/98, 99
See application file for complete search history.

(56) References Cited

U.S. PATENT DOCUMENTS

| | | | | |
|---|---|---|---|---|
| 2014/0167078 A1* | 6/2014 | Jang | ........................ | H01L 33/62 257/88 |
| 2014/0167083 A1* | 6/2014 | Phang | ..................... | H01L 33/62 257/98 |
| 2014/0339584 A1* | 11/2014 | Kim | ................... | C09K 11/0883 257/98 |

FOREIGN PATENT DOCUMENTS

CN             101819968 A         9/2010

* cited by examiner

*Primary Examiner* — Mark Tornow
(74) *Attorney, Agent, or Firm* — Steven Reiss (57) ABSTRACT

A photoelectric device includes an electrode structure, an LED (light emitting diode) element, a zener diode and a reflective cup. The LED element, the zener diode and the reflective cup are arranged on the electrode structure. The LED element and the zener diode are electrically connected in anti-parallel with each other. The reflective cup comprises an inner surface defined thereof and a nick defined in an outside of the reflective cup. The LED element is surrounded (Continued)

by the inner surface of the reflective cup and the zener diode is arranged in the nick.

7 Claims, 9 Drawing Sheets

(51) Int. Cl.
  *H01L 33/48* (2010.01)
  *H01L 29/866* (2006.01)

PHOTOELECTRIC DEVICE AND METHOD OF MANUFACTURING THE SAME

CROSS-REFERENCE TO RELATED APPLICATIONS

This is a continuation application. This application claims priority to Chinese Patent Application No. 201310687978.5 filed on Dec. 17, 2013, the contents of which are incorporated by reference herein.

FIELD

This disclosure relates to a photoelectric device, and particularly to a photoelectric device having a zener diode and a manufacturing method thereof.

BACKGROUND

A zener diode is always arranged beside an LED (light emitting diode) element in an LED package to prevent the LED diode from electrostatic damage.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. In addition, the description is not to be considered as limiting the scope of the embodiments described herein. The drawings are not necessarily to scale and the proportions of certain parts have been exaggerated to better illustrate details and features of the present disclosure.

Figure 1:
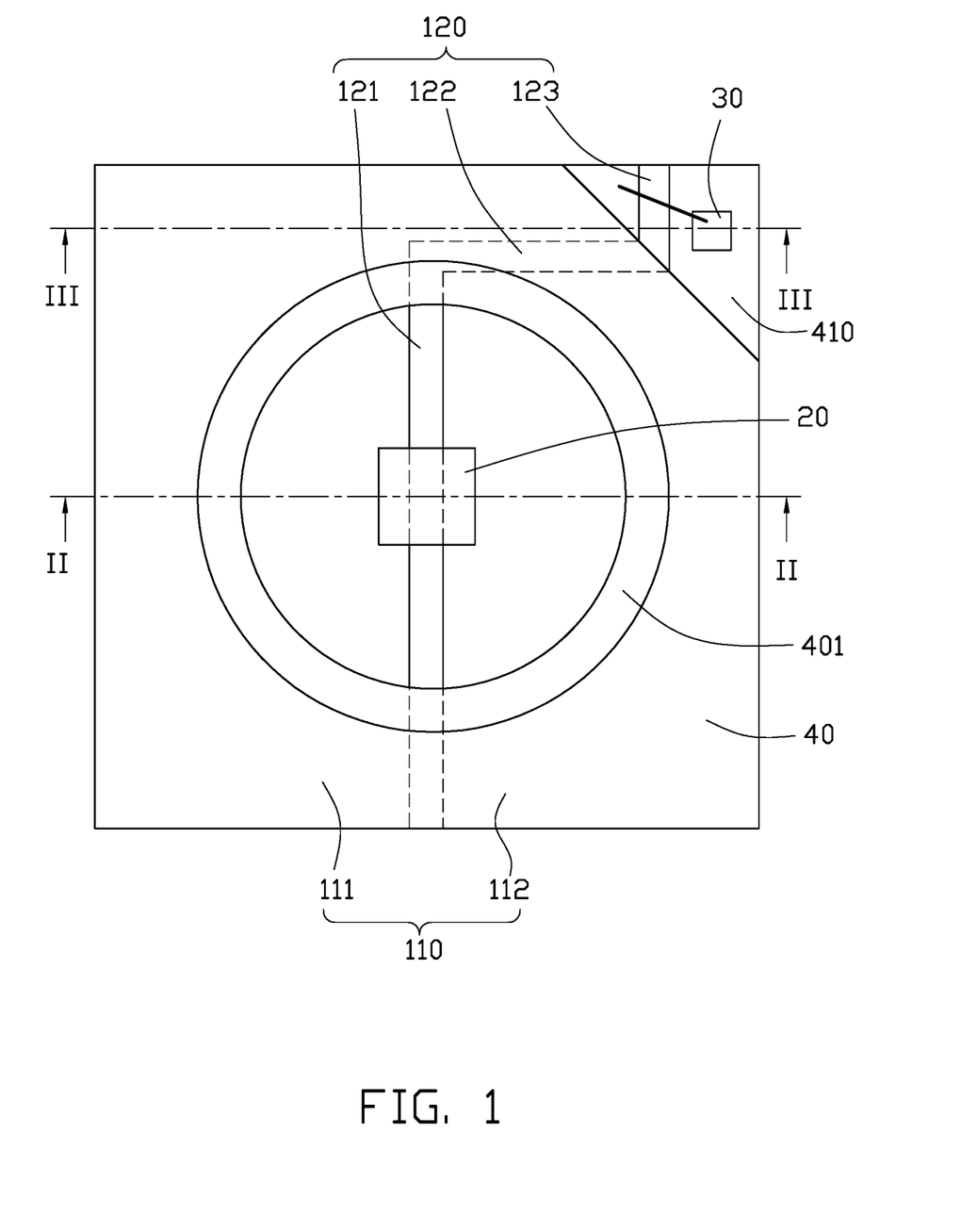
FIG. 1 is a top plan view of a photoelectric device in accordance with a first example embodiment of the present disclosure.
Figure 2:
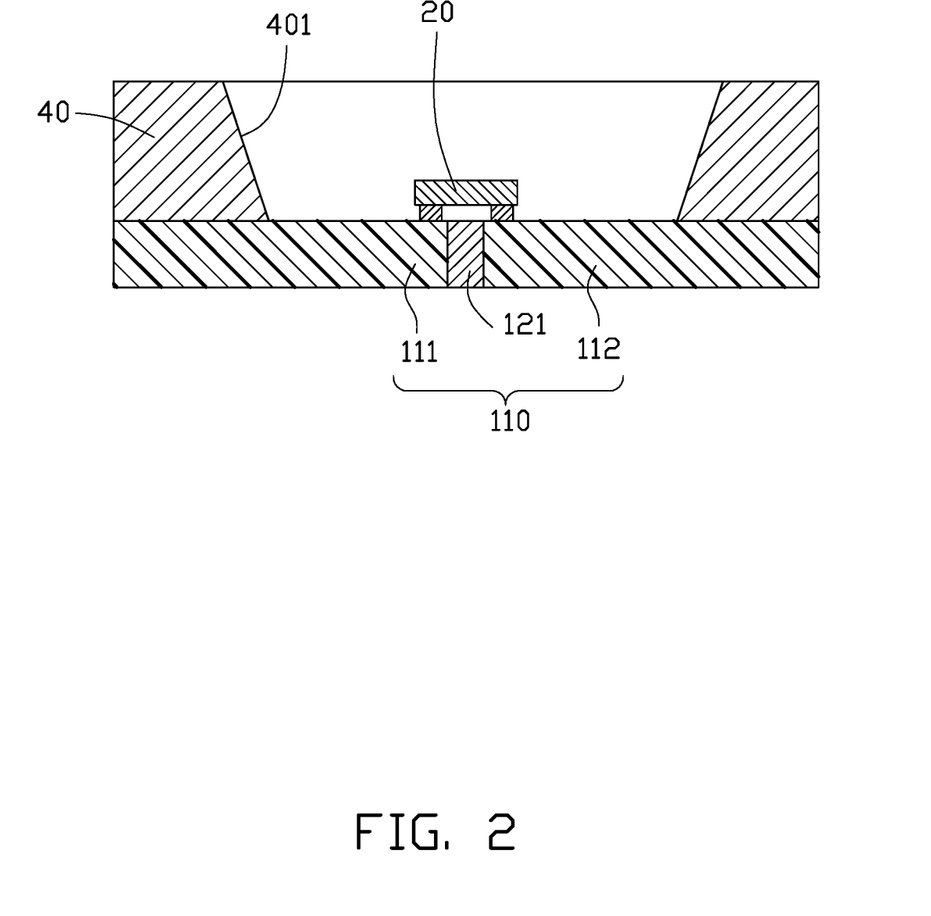
FIG. 2 is a cross-sectional view along II-II of the photoelectric device of FIG. 1.
Figure 3:
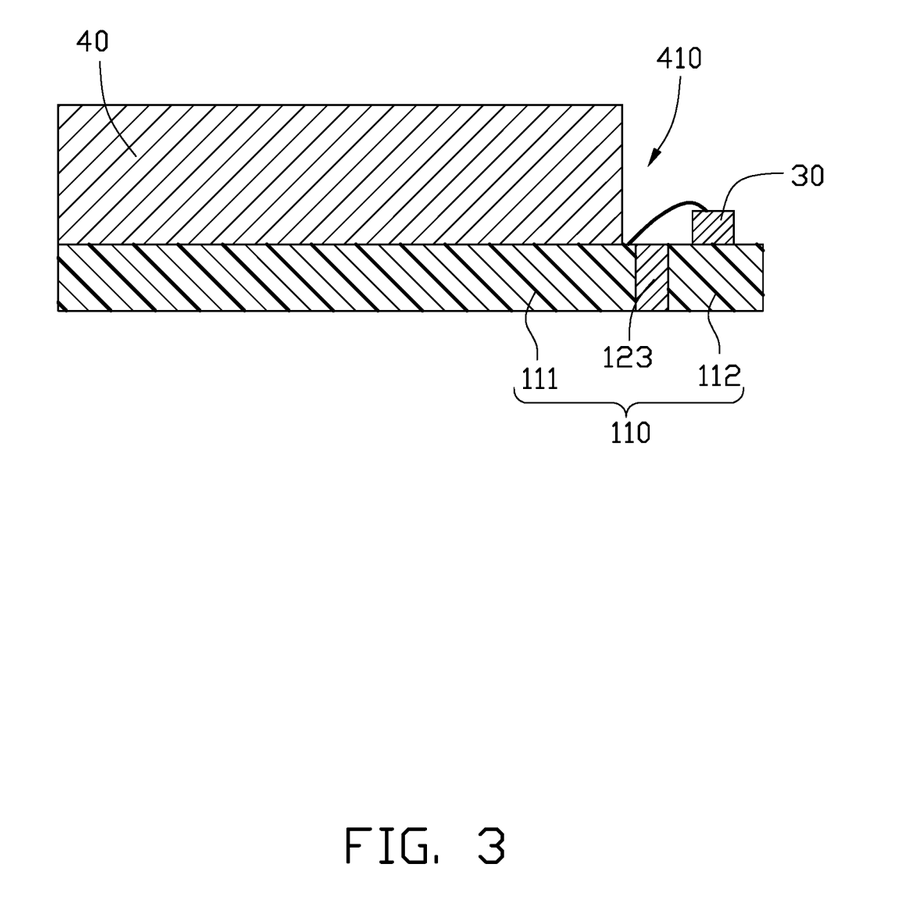
FIG. 3 is a cross-sectional view along of the photoelectric device of FIG. 1.
Figure 4:
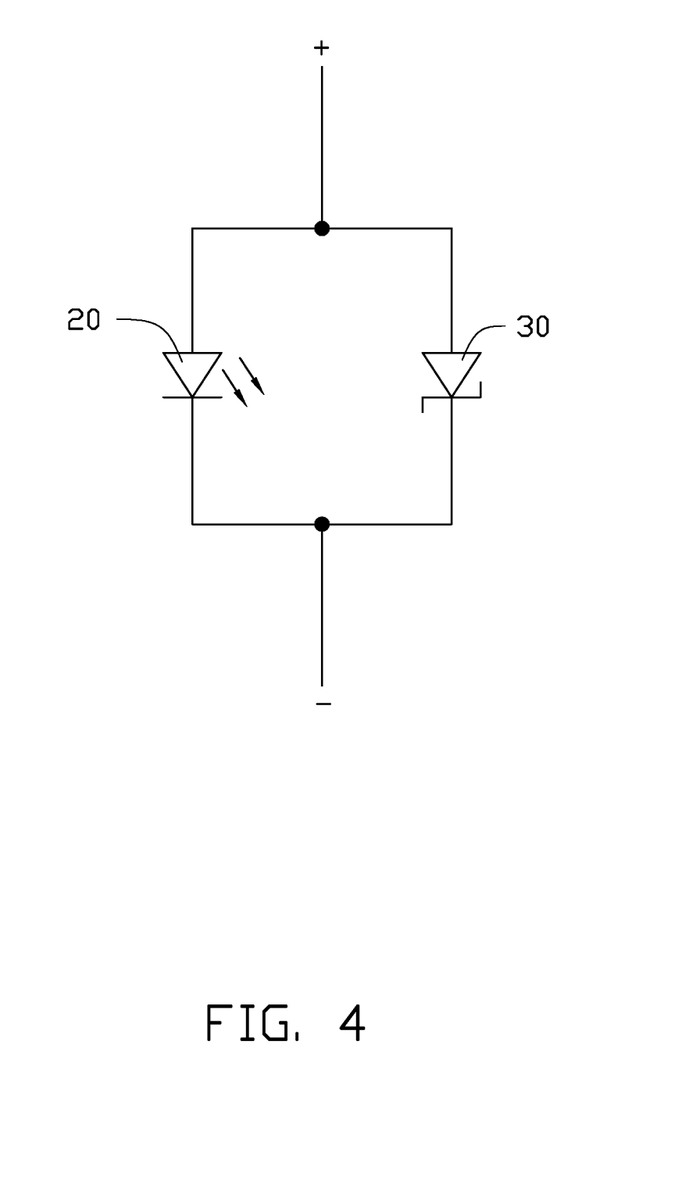
FIG. 4 is a circuit diagram of an LED element and a zener diode of the photoelectric device of FIG. 1.

Referring to FIGS. 1-3, a photoelectric device comprises an electrode structure 110, an LED element 20, a zener diode 30 and a reflective cup 40. The LED element 20, the zener diode 30 and the reflective cup 40 are arranged on the electrode structure 110. The LED element 20 and the zener diode 30 are electrically connected to the electrode structure 110. The LED element 20 and the zener diode 30 are electrically connected in anti-parallel with each other. FIG. 4 shows a circuit diagram of the LED element 20 and the zener diode 30.

The electrode structure 110 comprises a first electrode 111 and a second electrode 112. The LED element 20 and the zener diode 30 are electrically connected with the first electrode 111 and the second electrode 112. The first electrode 111 and the second electrode 112 are electrically insulated with each other. The insulating tape 120 is located between the first electrode 111 and the second electrode 112. The insulating tape 120 comprises a plurality of sub tapes. The LED element 20 is located at one of the sub tapes. The zener element 30 is located at the other one of the sub tapes. The insulating tape 120 can be made of insulating material. The insulating tape 120 can be made of epoxy molding compound (EMC) or sheet molding compound (SMC).

In at least one embodiment, the electrode structure 110 can have a square-shaped configuration. The insulating tape 120 can have a Z-shaped configuration. The insulating tape 120 comprises a first sub tape 121, a second sub tape 122 and a third sub tape 123. The second sub tape 122 interconnects the first sub tape 121 and the third sub tape 123. A length of the first sub tape 121 is larger than that of the second sub tape 122 or that of the third sub tape 123. The LED element 20 is located at the first sub tape 121. The zener diode 30 is located at the third sub tape 123.

The reflective cup 40 is formed on the electrode structure 110. The reflective cup 40 has an inner surface 401. The inner surface 401 can be a smooth surface. The one of sub tapes arranging the LED element 20 is exposed inside the reflective cup 40. A nick 410 is defined in an outside of the reflective cup 40. The other one of the sub tapes arranging the zener diode 30 is exposed through the nick 410. In at least one embodiment, the LED element 20 is arranged on the first sub tape 121. The LED element 20 is surrounded by the reflective cup 40. The inner surface 401 is rotational symmetry relative to an optic axis of the LED element 20. The first sub tape 121 is exposed inside the reflective cup 40. The zener diode 30 is arranged on the third sub tape 123. The third sub tape 123 is exposed through the nick 410.

Figure 5:
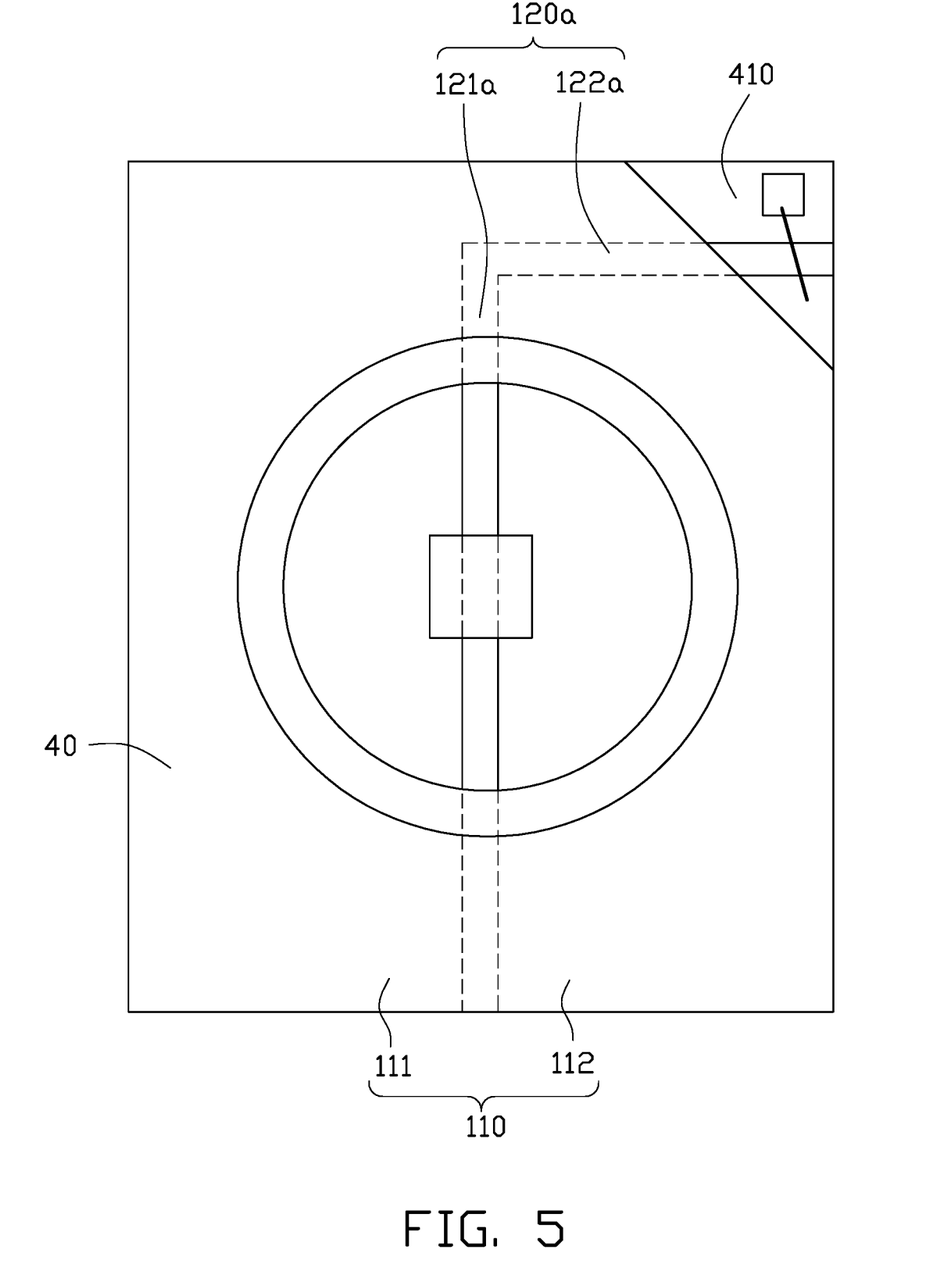
FIG. 5 is a top plan view of a photoelectric device in accordance with a second example embodiment of the present disclosure.

In at least one embodiment, referring to FIG. 5, the electrode structure 110 can be a rectangle. The insulating tape 120a has an L-shaped configuration. The insulating tape 120a can comprise a first sub tape 121a and a second sub tape 122a. A length of the first tape 121a is larger than that of the second tape 122a. The LED element 20 is located at the first sub tape 121a. The first sub tape 121a is exposed inside the reflective cup 40. The zener diode 30 is located at the second sub tape 122a. The second sub tape 122a is exposed through the nick 410.

Figure 6:
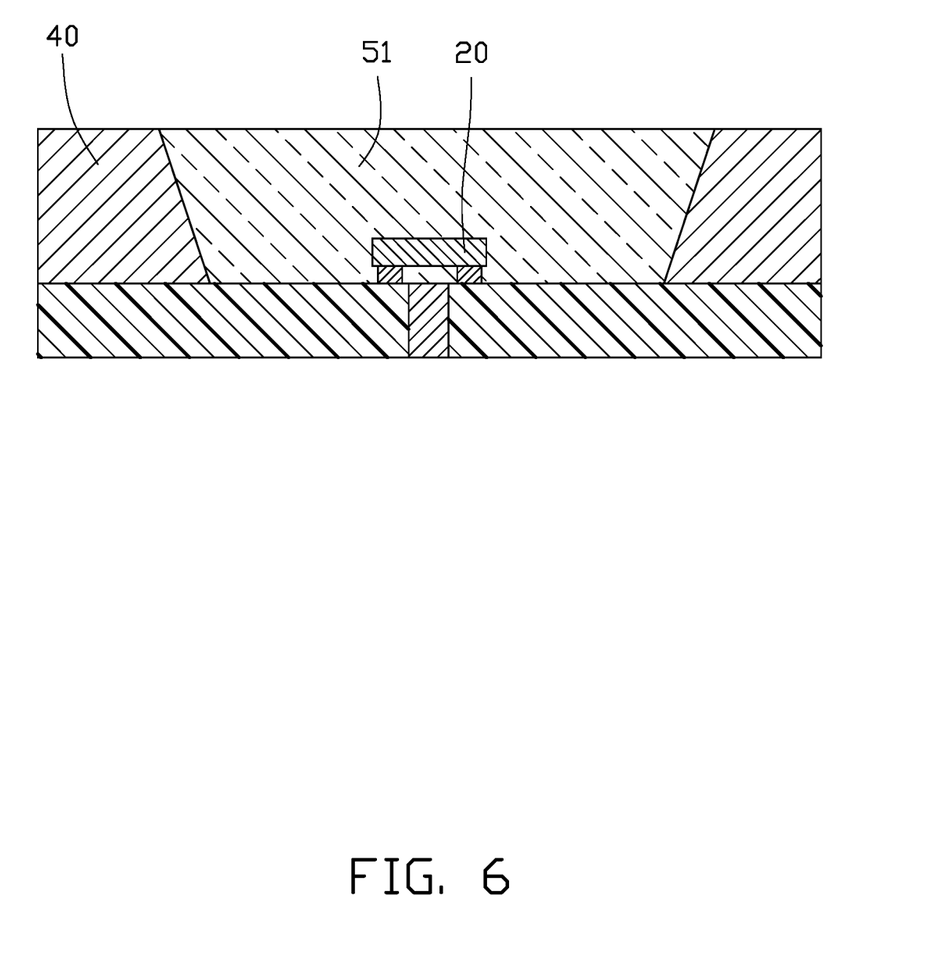
FIG. 6 is a cross-sectional view along II-II of the photoelectric device, wherein a first encapsulant covers the LED element of FIG. 1.
Figure 7:
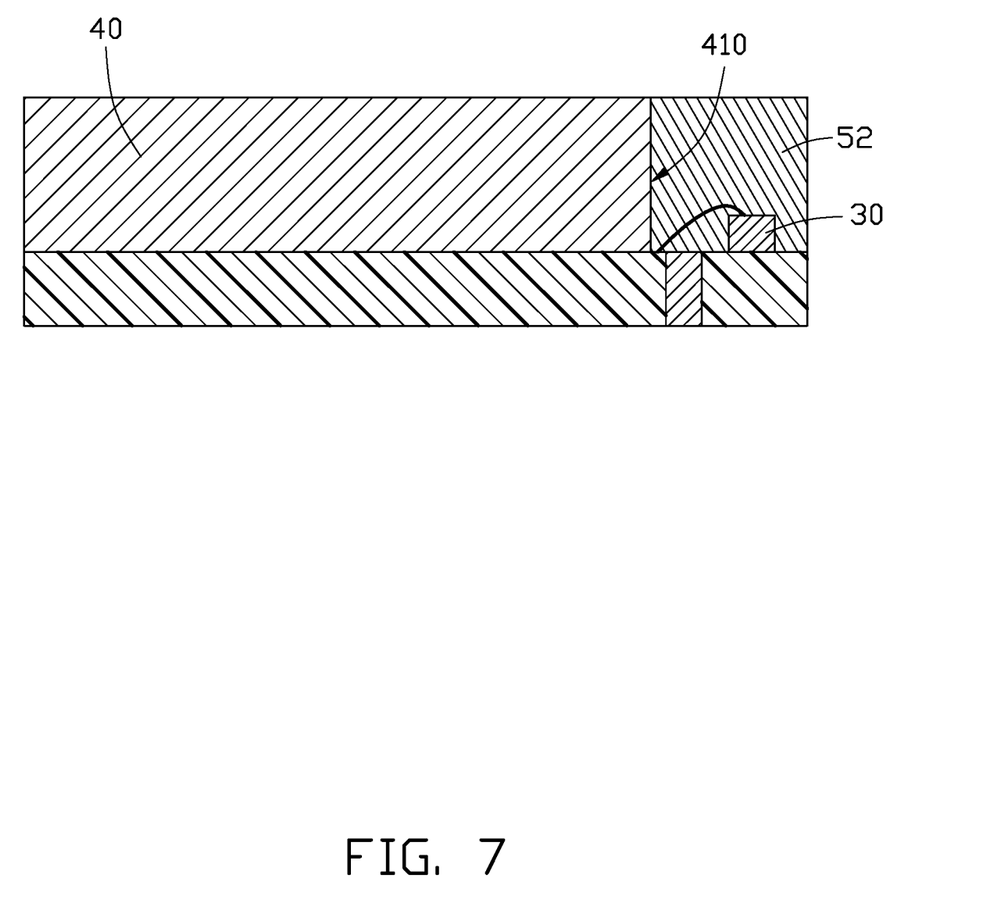
FIG. 7 is a cross-sectional view along of the photoelectric device, wherein a second encapsulant covers the zener diode of FIG. 1.

Referring to FIGS. 6 and 7, the photoelectric device further comprises a packaging structure 50. The packaging structure 50 covers the LED element 20 and the zener diode 30. The packaging structure 50 can comprise a first encapsulant 51 and a second encapsulant 52. The first encapsulant 51 covers the LED element 20. The first encapsulant 51 can be made of transparent material. The first encapsulant 51 can comprise phosphor powders. The second encapsulant 52 covers the zener diode 30. The second encapsulant 52 can be made of non-transparent material.

Figure 8:
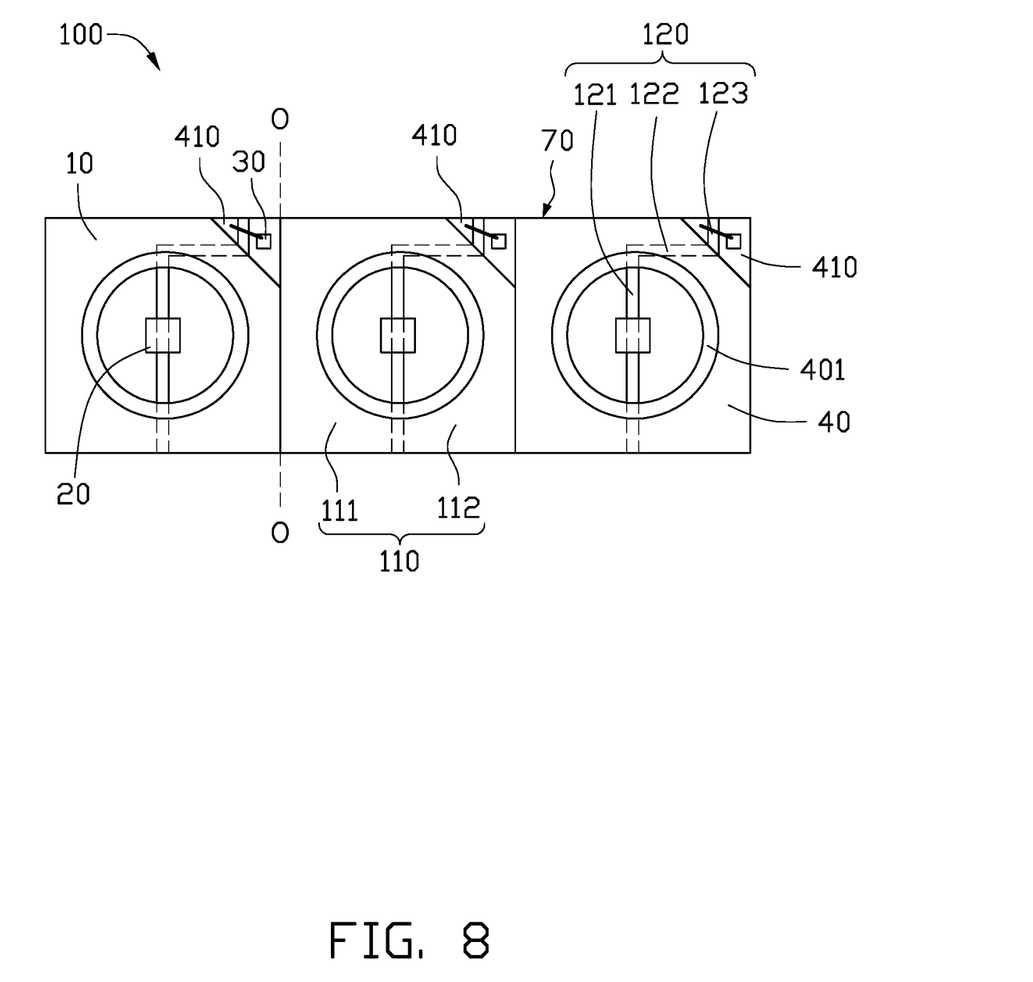
FIG. 8 is top plan view of photoelectric devices manufactured by a method in accordance with a first example embodiment of the present disclosure.

Referring to FIG. 8, the present disclosure also provides a method of manufacturing a photoelectric device, comprising providing an electrode structure group with a plurality of electrode structures, each electrode structure comprising a first electrode and a second electrode insulating the first electrode; forming a plurality of reflective cups on the electrode structure group, each reflective cup corresponding to one electrode structure, each reflective cup comprising an inner surface defined thereof and a nick defined in an outside of the reflective cup; arranging a plurality of LED elements on the electrode structures and the LED elements surrounded by the inner surface of the reflective cups; and arranging a plurality of zener diodes in the nicks.

An electrode structure group 100 comprises a plurality of electrode structures 10. Each electrode structure 100 comprises a first electrode 111 and a second electrode 112. The first electrode 111 and the second electrode 112 are electrically insulated with each other. An insulating tape 120 is located between the first electrode 111 and the second electrode 112. The insulating tape 120 comprises a plurality of sub tapes. In at least one embodiment, the insulating tape 120 can comprise a first sub tape 121, a second sub tape 122 and a third sub tape 123. The second sub tape 122 is connected between the first sub tape 121 and the third sub tape 123.

A plurality of reflective cups 40 is formed on the electrode structure group 100. Each reflective cup 40 corresponds to one electrode structure 10. An inner surface 401 is defined in each reflective cup 40. A nick 410 is defined in an outside of each reflective cup 40. One of the sub tapes is exposed inside the reflective cup 40. The other one of the sub tapes is exposed through the nick 410. In at least one embodiment, the first sub tape 121 is exposed inside the reflective cup 40. The second sub tape 122 is covered by the reflective cup 40. The third sub tape 123 is exposed through the nick 410.

A plurality of LED elements 20 each are arranged on the electrode structure group 100. Each LED element 20 is electrically connected with one electrode structure 110. Each LED element 20 is arranged in one reflective cup 40. The LED element 20 is surrounded by the reflective cup 40. The LED element 20 is located at the first sub tape 121.

A plurality of zener diodes 30 are arranged in the nicks 410 of reflective cups 40. Each zener diode 30 is electrically connected with one electrode structure 110. Each zener diode 30 is arranged in one nick 401. The zener diode 30 is located at the third sub tape 123. In each electrode structure 110, the LED element 20 is electrically connected in anti-parallel with the zener diode 30.

A plurality of packaging structures 50 covers the LED elements 20 and the zener diodes 30.

The electrode structure group 100 with the LED elements 20, the zener diodes 30 and the reflective cups 40 is cut to form a plurality of photoelectric devices. Each photoelectric device comprises one electrode structure 110 with one first electrode 111 and one second electrode 112, one LED element 20, one zener diode 30, one reflective cup 40 and one packaging structure 50.

In at least one embodiment, the electrode structure group 100 comprises three electrode structures 110. The nicks 410 are formed in a side 70 of the electrode structure group 100. The electrode structure group 100 with the LED elements 20, the zener diodes 30 and the reflective cups 40 can be cut along a line O-O.

Figure 9:
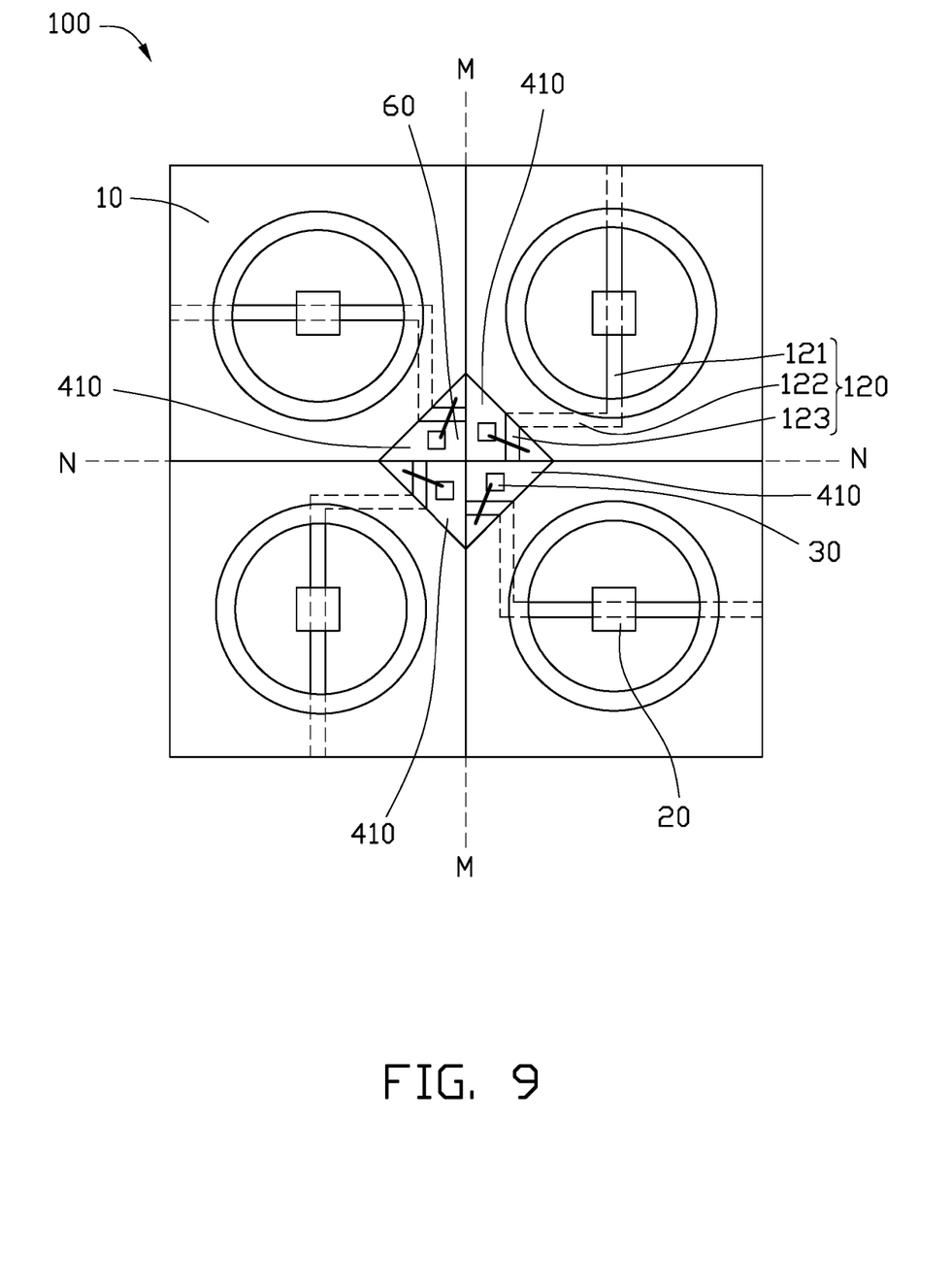
FIG. 9 is top plan view of photoelectric devices manufactured by a method in accordance with a second example embodiment of the present disclosure.

In at least one embodiment, referring to FIG. 9, the electrode structure group 100 comprises four electrode structures 110. The nicks 410 are formed in a center 60 of the electrode structure group 100. The electrode structure group 100 with the LED elements 20, the zener diodes 30 and the reflective cups 40 can be cut along a line M-M and a line N-N.

It is to be further understood that even though numerous characteristics and advantages have been set forth in the foregoing description of embodiments, together with details of the structures and functions of the embodiments, the disclosure is illustrative only. Changes may be made in the details, including in matters of shape, size, and arrangement of parts within the principles of the disclosure to the full extent indicated by the broad general meaning of the terms in which the appended claims are expressed.

What is claimed is:

1. A method of manufacturing a photoelectric device, comprising:
   providing an electrode structure group with a plurality of electrode structures, each electrode structure comprising a first electrode and a second electrode insulated from the first electrode;
   forming a plurality of reflective cups on the electrode structure group, each reflective cup corresponding to one electrode structure, each reflective cup comprising an inner surface defined thereof and a nick defined in an outside of the reflective cup;
   arranging a plurality of LED elements on the electrode structures and the LED elements surrounded by the inner surface of the reflective cups and electrically connected with the first electrode and the second electrode inside the inner surface of the reflective cup; and
   arranging a plurality of zener diodes in the nicks and electrically connected with the first electrode and the second electrode outside the reflective cup.

2. The method of claim 1, wherein an insulating tape is located between the first electrode and the second electrode.

3. The method of claim 2, wherein the insulating tape comprises a plurality of sub tapes.

4. The method of claim 3, wherein the LED element is arranged at one of the sub tapes, the zener element is arranged at the other one of the sub tapes.

5. The method of claim 2, wherein the insulating tape comprises a first sub tape exposed inside the reflective cup, a second sub tape covered by the reflective cup and a third sub tape exposed through the nick, the second sub tape is connected between the first sub tape and the third sub tape, the LED element is located at the first sub tape, and the zener element is located at the third sub tape.

6. The method of claim 5, wherein a length of the first sub tape is larger than that of the second sub tape or that of the third sub tape.

7. The method of claim 1 further comprising a packaging structure, and the packaging structure covers the LED element and the zener diode.

* * * * *